United States Patent [19]

Blatter et al.

[11] Patent Number: 4,544,923
[45] Date of Patent: Oct. 1, 1985

[54] MICROPROCESSOR SELF-TURN-OFF ARRANGEMENT FOR A CONSUMER INSTRUMENT

[75] Inventors: Harold Blatter, Indianapolis; Joseph E. S. Amaral, Carmel, both of Ind.

[73] Assignee: RCA Corporation, Princeton, N.J.

[21] Appl. No.: 452,114

[22] Filed: Dec. 22, 1982

[51] Int. Cl.⁴ .................. H04Q 9/00; G06F 1/00; H04B 9/00
[52] U.S. Cl. .................. 340/825.69; 307/140; 340/365 S; 455/127; 455/618; 358/194.1
[58] Field of Search .................. 307/139–141; 340/825.69, 365 R, 365 S, 696; 364/707; 455/127, 603, 613, 618; 365/227; 358/194.1

[56] References Cited

U.S. PATENT DOCUMENTS

| | | | |
|---|---|---|---|
| 3,671,659 | 6/1972 | Suzuki | 84/1.17 |
| 4,259,594 | 3/1981 | Fox et al. | 307/141 |
| 4,271,404 | 6/1981 | Tanaka | 364/707 |
| 4,276,483 | 6/1981 | Hayden | 307/10 R |
| 4,291,261 | 9/1981 | Johnston | 318/482 |
| 4,362,954 | 12/1982 | Cotton | 307/142 |
| 4,381,459 | 4/1983 | Cotton | 307/139 |
| 4,418,416 | 11/1983 | Lese et al. | 455/618 |
| 4,463,646 | 8/1984 | Mitarai | 364/707 |

OTHER PUBLICATIONS

COPS Microcontrollers Databook, 1982, by National Semiconductor Corporation.
Page 23 of RCA Corporation "Color Television Basic Service Data–CTC-111 Series", Copyright 1982 and Published in Apr. 1982.

Primary Examiner—Donald J. Yusko
Attorney, Agent, or Firm—Eugene M. Whitacre; Paul J. Rasmussen; Joseph J. Laks

[57] ABSTRACT

In a battery operated, remote transmitter for a consumer instrument, a microprocessor controls operation of the transmitter. The collector current path of a PNP on-off transistor is coupled between the battery and a voltage supply terminal of the microprocessor. To power up the microprocessor, a keyboard switch in the transmitter is depressed in order to ground the base of the on-off transistor and turn on the transistor. An NPN transistor forms a latch with the PNP transistor to maintain the on-off transistor conductive. After completion of the transmitter signaling, the microprocessor switches an output port to the ground state. The output port is coupled to the base of the NPN transistor and bypasses current therefrom to initiate the regenerative deactivation of the latch. With the latch deactivated, conduction of the on-off transistor is cut off. The voltage supply terminal of the microprocessor is disconnected from the battery to power down the remote transmitter. The emitter of the NPN transistor is coupled to a tap on the battery to ensure reliable self-turn-off of the microprocessor.

9 Claims, 1 Drawing Figure

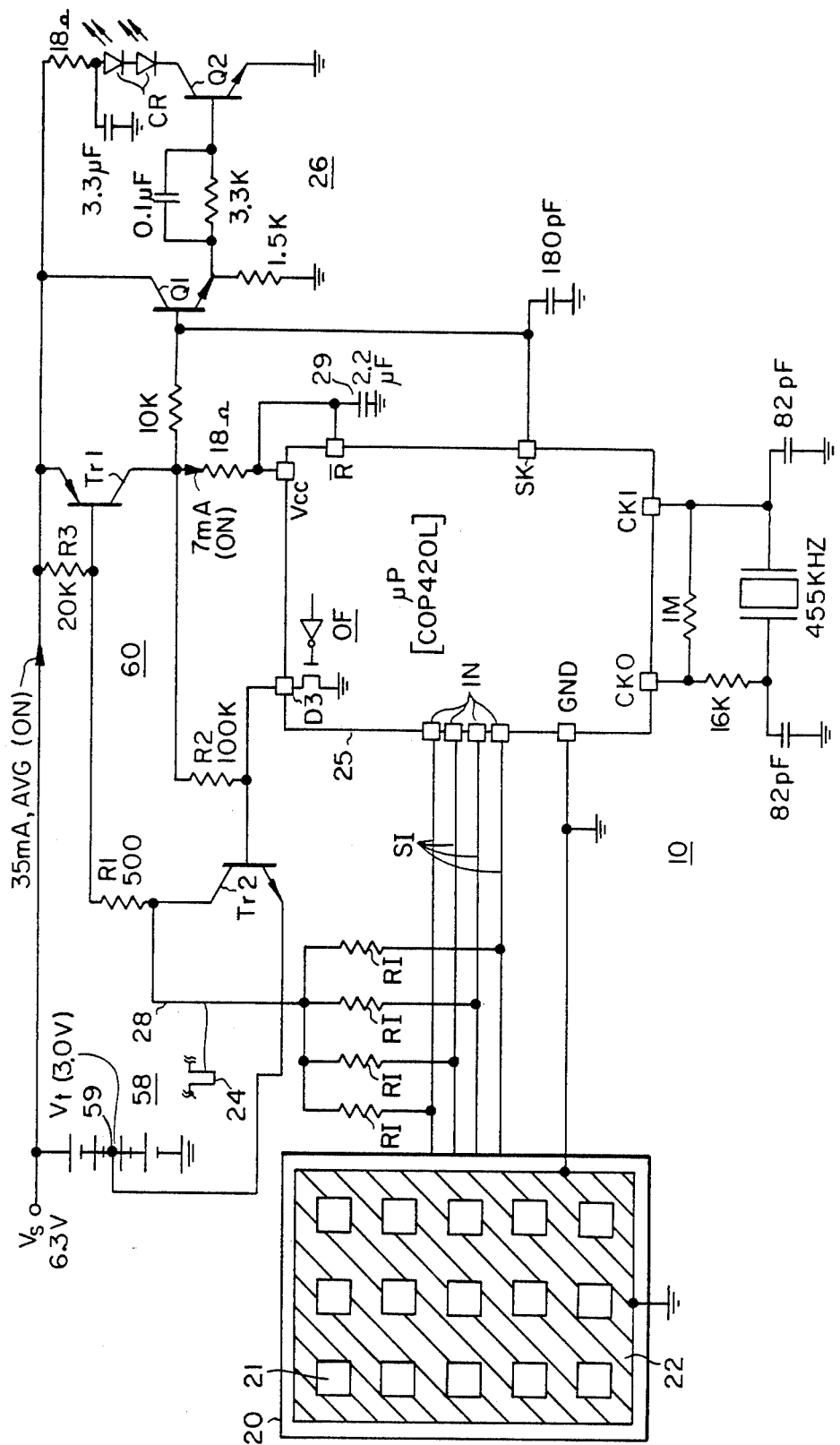

MICROPROCESSOR SELF-TURN-OFF ARRANGEMENT FOR A CONSUMER INSTRUMENT

This invention relates to an on-off arrangement for a digital controller, such as a microprocessor, that, e.g. controls operation of a remote transmitter in a consumer instrument.

The remote transmitter of a consumer instrument, such as a color television receiver or a video disc player, may be battery operated and controlled in operation by microprocessor. To conserve battery power, the remote transmitter is powered up only during those intervals when a command signal for the instrument remote receiver circuitry is being generated by the transmitter.

In a typical keyboard transmitter arrangement, an electrically conductive contact sheet is connected to electrical ground. Each of the keyboard switches is positioned over the contact sheet and spaced apart from it. Signal lines from input ports of the microprocessor are connected to the keyboard switches.

When a keyboard switch corresponding to a given function or command to be transmitted is depressed, the switch makes electrical connection to the grounded contact sheet thereby grounding the signal line or lines connected to that switch. The input port or ports of the microprocessor that are connected to the signal lines become grounded to provide an indication to the microprocessor that the particular command is to be transmitted.

To power up the microprocessor when any of the keyboard switches are depressed, each of the signal lines connected to the switches is also connected to the control terminal of an on-off transistor switch. The collector to emitter path of the transistor is connected between the battery that generates, illustratively, 6.3 V of operating voltage and the voltage supply terminal of the microprocessor. When a signal line is grounded to the contact sheet, the control terminal of the on-off transistor switch is also grounded, turning on the transistor and enabling main power to be supplied from the battery to the voltage supply terminal of the microprocessor.

After the command has been transmitted by the remote transmitter, it is desirable to power down the microprocessor and associated transmitter circuitry to conserve battery power. The microprocessor itself provides a power down command signal to the on-off switching transistor to cutoff conduction in the transmitter and disconnect the battery from the microprocessor voltage supply terminal.

In accordance with an aspect of the invention, the on-off transistor is part of a latch arrangement. The off-command of the microprocessor is applied to a control terminal of the latch. The keyboard switch input signal lines are connected to another control terminal of the latch.

In accordance with another aspect of the invention, the latch, in addition to the on-off transistor, includes a second transistor having its emitter biased at a voltage intermediate the battery voltage and zero volts. Such an arrangement prevents the latch from being erroneously reactivated after microprocessor self-turn-off has been initiated and the supply voltage to the microprocessor has decayed below the minimum value needed for reliable microprocessor operation.

The sole drawing FIGURE illustrates a remote control transmitter for a consumer instrument including on-off circuitry embodying the invention.

In the battery operated, microprocessor controlled, remote transmitter 10, illustrated in the FIGURE, each contact switch 21 of a keyboard assembly 20 is coupled to one or more of a plurality of signal lines SI connecting the contact switches to a plurality of input ports IN of a digital controller, microprocessor 25. By way of example, only four signal lines and input ports are illustrated in the FIGURE. In practice, between ten and twenty signal lines and input-ports may be provided. Microprocessor 25 may be selected as a COP420L, manufactured by National Semiconductor Corporation, Santa Clara, Calif.

Keyboard assembly 20 includes an electrically conductive contact sheet 22 electrically connected to the ground terminal of the remote transmitter circuitry. Alternatively contact sheet 22 may be constructed as a plastic, nonconductive sheet with electrically conductive conductor lines printed thereon and electrically connected to ground. Contact sheet 22 is located below and spaced apart from each contact switch 21. Depressing a contact switch grounds the associated signal line or lines and therefore grounds the corresponding input port or ports.

To transmit a particular command signal, such as a "CHANNEL SCAN" command signal for sequentially selecting channels, when the remote transmitter is part of a remote controlled television receiver, or such as a "PLAY" or "PAUSE" command signal to play back and to momentarily stop and start play back, respectively, when the remote transmitter is part of a remote controlled video disc or tape player, the operator depresses the appropriate one of the contact switches 21 that represents the command signal to be transmitted. The corresponding signal line or lines SI are grounded, thereby grounding the corresponding input port or ports IN.

Microprocessor 25 interrogates the switching states of the input ports IN. Upon determining that a particular combination of input ports are in the low or ground state, microprocessor 25 generates at an output port SK a serial flow of coded pulses corresponding to the command selected by the operator. These pulses are applied to the transmitting portion 26 of remote transmitter 10. When output port SK is in the low state, the port is grounded through the conducting source-drain path of an MOS transistor of output interface circuitry associated with the port and not illustrated in the FIGURE. Accordingly, transistors Q1 and Q2 are cut off, preventing current from flowing in light emitting diodes CR. When output port SK is in the high state, transistor Q1 turns on, turning on transistor Q2 to enable current to flow in light emiting diodes CR. In this manner, coded signal pulses at terminal SK, representing a given command, are converted by the light emitting diode transducers into coded light pulses for reception by the remote receiver.

Main power for remote transmitter 10 is obtained from a battery pack 58 providing, illustratively 6.3 volts at supply rail $V_s$ relative to the grounded terminal of the battery pack. The power is supplied through the main current conduction, collector-to-emitter path of an on-off switching transistor Tr1. The collector of transistor Tr1 is coupled to the base of transistor Q1 to control the energization of transmitting portion 26. The collector of transistor Tr1 is also coupled to the $V_{cc}$ voltage supply terminal that provides power to microprocessor 25. A resistor R3 is coupled between the base and emitter electrodes of transistor Tr1.

In the powered down state of remote transmitter 10, transistor Tr1 is non-conductive, disconnecting battery pack 58 from microprocessor 25 and from the control terminal of transmitting portion 26. No significant power is drained from the battery pack in the powered down state.

Remote transmitter 10 is powered up when a keyboard contact switch 21 is depressed. Signal lines SI are coupled through respective resistors RI to a signal line 28. Signal line 28 is coupled through a resistor R1 to the base control terminal of transistor Tr1.

Depressing a contact switch 21 generates an on-command signal 24 along signal line 28 during the time that the contact switch is depressed. The base of transistor Tr1 is coupled to ground through resistor R1 and the appropriate one of the resistors RI. Base current flows in transistor Tr1, turning the transistor on. The 6.3 volt supply rail volta $V_s$ is applied to the $V_{cc}$ terminal to power up microprocessor 25. The $V_{cc}$ terminal is coupled to a capacitor 29 and to a RESET-BAR input port $\overline{R}$ of microprocessor 25.

Microprocessor 25 includes an output port D3. The logical switching state of output port D3 is controlled by microprocessor 25 by means of an output interface circuitry OF that includes an enhancement mode MOS transistor coupled to the output port and arranged in an open drain configuration. To switch the logical state of output port D3 to the low state, microprocessor 25 turns on the MOS transistor of interface circuitry OF, thereby grounding the output port. To switch the logical state of output port D3 to the high state, the MOS transistor is made nonconductive.

The collector output electrode of on-off switching transistor Tr1 is coupled through a resistor R2 to the base control electrode of a transistor Tr2. The collector output electrode of transistor Tr2 is coupled through resistor R1 to the base control electrode of transistor Tr1 thereby forming a regenerative latching arrangement 60 comprising transistors Tr1 and Tr2. The emitter of transistor Tr2 is coupled to a tap terminal 59 of battery pack 58 for purposes hereinafter to be described.

Upon initial power-up of microprocessor 25, the initialization hardware logic of the microprocessor, not illustrated in the FIGURE, such as the initialization logic found in the aforementioned COP420L, switches output port D3 to the ground state. The programming of the microprocessor is such that immediately after initialization, output port D3 is switched to the open drain MOS, logical high, switching state. Latch 60 becomes activated by the collector current from transistor Tr1 flowing to the base of transistor Tr2 through resistor R2. Thus, transistor Tr1 remains conductive after on-command signal 24 has been completed and signal lines SI are no longer grounded. The tap voltage $V_t$, nominally 3.0 volts, at battery pack terminal 59, is sufficiently lower than the voltage at the collector of transistor Tr1 to enable transistor Tr2 to be maintained in a forward biased condition.

Upon completion of the command signal transmission, the microprocessor switches the output state of port D3 to the low, ground state by means of the conduction of the enhancement mode MOS transistor in output interface circuitry OF. Latch current from the collector of transistor Tr1 is diverted from the base of transistor Tr2 to ground through port D3. Transistor Tr2 begins to turn off, turning off transistor Tr1 in a regenerative manner. Thus when port D3 is switched to ground, latch 60 becomes deactivated, disconnecting the battery pack supply rail $V_s$ from the $V_{cc}$ supply terminal of microprocessor 25.

The voltage at the $V_{cc}$ terminal begins to decay as capacitor 29 discharges into that terminal and the $\overline{R}$ input port. After the voltage at the $V_{cc}$ terminal has decayed from its on-state value of around 6.3 volts to a value near the tap voltage $V_t$ of 3.0 volts, deactivation of latch 60 is assured for the entire interval that the voltage at the $V_{cc}$ terminal decays to zero volts. This result follows because after the voltage at the $V_{cc}$ terminal decays to near the threshold voltage $V_t$, transistor Tr2 cannot become forward biased even after port D3 has lost its capability of sinking current. Thus, when the voltage at the $V_{cc}$ terminal has decayed below the minimum voltage that enables microprocessor 25 to reliably maintain the MOS transistor of interface circuitry OF conductive, latch 60 cannot be erroneously reactivated by the residual voltage at the $V_{cc}$ terminal. That residual voltage is not great enough relative to the voltage $V_t$ at battery pack tap terminal 59 to turn transistor Tr2 back on.

The inventive arrangement of an on-off switching transistor configured with a second transistor in a latching arrangement provides for turn-on of the microprocessor by activation of the on-off switching transistor, the maintaining of the on-off transistor in the conductive mode by continuous latch energization, and the self turn-off of the microprocessor when the microprocessor deactivates the latch.

An additional feature of the inventive arrangement of the FIGURE is the biasing of the emitter of transistor Tr2 at an intermediate voltage between zero volts and the battery voltage $V_s$. An advantage of such an arrangement is that latch 60 cannot erroneously turn itself back on when the supply voltage decreases below the minimum necessary to maintain the MOS transistor of interface circuitry OF fully conductive.

Had the emitter of transistor Tr2 been connected to ground rather than to battery pack tap terminal 59, then, when the voltage at the $V_{cc}$ supply terminal decayed to some low value, port D3 would be unable to sink current. The residual voltage at the $V_{cc}$ terminal would make transistor Tr2 conductive. Transistor Tr1 would become conductive to begin bringing the voltage at the $V_{cc}$ terminal back up to the battery voltage $V_s$. The initialization hardward within the microprocessor would then be activated to bring port D3 to ground to again deactivate latch 60. An undesirable partial off-mode operation could result that draws battery current.

By coupling a source of bias voltage $V_t$ to the emitter of transistor Tr2, such quasistable mode of operation is avoided. The application of the bias voltage $V_t$ to the emitter of transistor Tr2 also reduces the off-state leakage current in the collector and base circuits of transistor Tr2.

What is claimed is:

1. An on-off arrangement for a digital controller operated by a microprocessor in a power-up condition, comprising:
    a DC power supply for developing a DC voltage at a DC voltage supply terminal of said digital controller for providing main power thereto;
    a switch having a main current path coupled between said DC voltage supply terminal and a supply terminal of said microprocessor, conduction in said main current path being controlled by a control terminal of said switch;

means for forming a regenerative latch coupled to said switch control terminal to maintain said main current path conductive once said latch is energized;

means coupled to said switch control terminal for applying a turn-on signal thereto to initiate the conduction of current in said main current path from said DC voltage supply terminal to the microprocessor supply terminal to power-up said microprocessor and activate said digital controller, said latch being energized upon application of said turn-on signal; and an output port of said said microprocessor coupled to a point in the regenerative current path of latch for providing an alternate path via said output port for current that bypasses at least a portion of said latch to initiate a regenerative deenergization thereof for cutting off conduction in said main current path to power-down said microprocessor.

2. An on-off arrangement for a digital controller, comprising:

a voltage supply terminal of said digital controller for providing main power thereto;

a source of supply voltage;

first switch having a main current path coupled between said voltage supply terminal and said source of supply voltage, conduction in said main current path being controlled by a control terminal of said switch;

means for forming a regenerative latch and coupled to said first switch control terminal to maintain said main current path conductive once said latch is activated, wherein said latch forming means comprises a second switch having a main current path and a control terminal to control the conduction thereof, and including a source of bias voltage coupled to said second switch;

means coupled to said first switch control terminal for applying a turn-on signal thereto to initiate the conduction of current in said main current path to power-up said digital controller, said latch being activated upon application or turn-on signal; and an output port of said digital controller coupled to said latch for providing an alternate path for current that bypasses at least a portion of said latch to initiate the regenerative deactivation thereof for cutting off conduction in said main current path to power-down said digital controller.

3. An arrangement according to claim 2 wherein said output port is coupled to the control terminal of said second switch and including interface circuitry of said digital controller coupled to said output port for bypassing current from said control terminal of said second switch to deactivate said latch.

4. An arrangement according to claim 3 wherein said interface circuitry includes an open drain configured MOS transistor coupled to said output port and a point of reference potential.

5. An arrangement according to claim 4 wherein said first switch comprises a PNP transistor and said second switch comprises an NPN transistor, the emitter of said PNP transistor being coupled to said source of supply voltage, the collector of said PNP transistor being coupled to said voltage supply terminal and to the base of said NPN transistor, the base of said NPN transistor being coupled to said output port, the collector of said NPN transistor being coupled to the base of said PNP transistor, the emitter of said NPN transistor being coupled to said source of bias voltage.

6. An arrangement according to claim 5 wherein said source of supply voltage comprises a battery and wherein said source of bias voltage comprises an intermediate voltage tap point of said battery.

7. An arrangement according to claim 6 wherein the control terminal of said first switch comprises the base of said PNP transistor and wherein said turn-on signal applying means comprises a switch that couples the base of said PNP transistor to said point of reference potential.

8. An arrangement according to claim 7 including a signal port of said digital controller for developing a coded output signal and a signal transducer responsive to said coded output signal for transmitting to a receiving unit a signal representative of said coded output signal.

9. An on-off arrangement for a television remote control transmitter that includes a microprocessor for controlling the operation thereof, comprising:

a DC power supply for developing a DC voltage at a DC voltage supply terminal of said digital controller for providing main power thereto;

a switch having a main current path coupled between said DC voltage supply terminal and a supply terminal of said microprocessor, conduction in said main current path being controlled by a control terminal of said switch;

means for forming a regenerative latch coupled to said switch control terminal to maintain said main current path conductive once said latch is energized;

a transmitting circuit activated by said microprocessor for generating a television remote control signal and so coupled to said DC power supply to draw current therefrom when activated and to draw no current therefrom during standby;

means coupled to said switch control terminal for applying a turn-on signal thereto to initiate the conduction of current in said main current path from said DC power supply to the microporcessor supply terminal to power-up said microprocessor and activate said transmitting circuit, said latch being energized upon application of said turn-on signal; and an output port of said microprocessor coupled to a point in the regenerative current path of said latch for providing an alternate path via said output port for current that bypasses at least a portion of said latch to initiate a regenerative deenergization thereof for cutting off conduction in said main current path to power-down said microprocessor without drawing current from said DC power supply during standby.

* * * * *

UNITED STATES PATENT AND TRADEMARK OFFICE
CERTIFICATE OF CORRECTION

PATENT NO. : 4,544,923
DATED : October 1, 1985
INVENTOR(S) : Harold Blatter et al It is certified that error appears in the above-identified patent and that said Letters Patent is hereby corrected as shown below:

Column 2, line 12, that portion reading "line-ports" should read --line port--. Column 3, line 7 that portion reading "terminal" should read --terminals--. Column 3, line 21, that portion reading "volta" should read --voltage--. Column 5, line 15, that portion reading "said said" should read --said--. Column 5, line 16, after "of" and before "latch" insert --said--. Column 6, line 14, that portion reading "An-arrangement" should read --An arrangement--.

Signed and Sealed this

Fifth Day of August 1986

[SEAL]

Attest:

DONALD J. QUIGG

Attesting Officer

Commissioner of Patents and Trademarks